United States Patent
Krijn et al.

(10) Patent No.: US 9,655,183 B2
(45) Date of Patent: May 16, 2017

(54) TOPOLOGY OF DISTRIBUTING AND CONNECTING LEDS IN A LARGE AREA MATRIX

(75) Inventors: Marcellinus Petrus Carolus Michael Krijn, Eindhoven (NL); Johannes Wilhelmus Weekamp, Beek en Donk (NL); Hugo Johan Cornelissen, Escharen (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 50 days.

(21) Appl. No.: 14/241,111

(22) PCT Filed: Aug. 31, 2012

(86) PCT No.: PCT/IB2012/054489
§ 371 (c)(1),
(2), (4) Date: Feb. 26, 2014

(87) PCT Pub. No.: WO2013/035024
PCT Pub. Date: Mar. 14, 2013

(65) Prior Publication Data
US 2014/0361709 A1    Dec. 11, 2014

Related U.S. Application Data

(60) Provisional application No. 61/603,413, filed on Feb. 27, 2012.

(30) Foreign Application Priority Data

Sep. 6, 2011   (EP) .................................. 11180249

(51) Int. Cl.
*H05B 37/00*  (2006.01)
*H05B 33/08*  (2006.01)
(Continued)

(52) U.S. Cl.
CPC ........... *H05B 33/0824* (2013.01); *F21K 9/00* (2013.01); *F21S 4/00* (2013.01); *F21V 23/003* (2013.01);
(Continued)

(58) Field of Classification Search
USPC ......... 315/185 R, 191, 192, 193, 185 S, 291, 315/307, 308
See application file for complete search history.

(56) References Cited

U.S. PATENT DOCUMENTS 6,288,497 B1   9/2001  Chang
6,575,595 B1   6/2003  Wu
(Continued)

FOREIGN PATENT DOCUMENTS

EP    2306070 A1   6/2011
GB    2276032 A    9/1994
(Continued)

*Primary Examiner* — Douglas W Owens
*Assistant Examiner* — Jianzi Chen

(57) ABSTRACT

A LED circuit comprises an array of LEDs is arranged in a matrix. The matrix is connected to at least three power rail lines. The LEDs are formed as a first LED arrangement (34) between a first power rail line (30) and a second power rail line (32) and a second LED arrangement (36) between the second power rail line (32) and a third power rail line (30) of the same voltage as the first power rail line. This means there are alternating power rail lines interspersed with the matrix of LEDs. This enables the driving voltages to be kept low and it improves scalability of the design.

1 Claim, 4 Drawing Sheets

(51) Int. Cl.
    *G09G 3/32*         (2016.01)
    *G02F 1/1335*     (2006.01)
    *F21K 9/00*        (2016.01)
    *F21S 4/00*        (2016.01)
    *F21V 23/00*      (2015.01)
    *F21V 23/04*      (2006.01)
    *F21Y 101/00*     (2016.01)

(52) U.S. Cl.
    CPC ........ *F21V 23/04* (2013.01); *G02F 1/133603* (2013.01); *G09G 3/32* (2013.01); *H05B 33/0821* (2013.01); *F21Y 2101/00* (2013.01); *G02F 2001/133612* (2013.01); *G09G 2300/0426* (2013.01); *H01L 2924/0002* (2013.01)

(56) References Cited

U.S. PATENT DOCUMENTS

| | | | |
|---|---|---|---|
| 7,049,757 B2 * | 5/2006 | Foust et al. | 315/185 S |
| 7,319,246 B2 | 1/2008 | Soules et al. | |
| 8,552,420 B2 * | 10/2013 | Levermore | H01L 27/3202 257/40 |
| 2002/0161988 A1 | 10/2002 | Barlow et al. | |
| 2003/0198048 A1 | 10/2003 | Frederick | |
| 2004/0101268 A1 | 5/2004 | Shih et al. | |
| 2007/0247847 A1 | 10/2007 | Villard | |
| 2009/0167202 A1 * | 7/2009 | Miskin | H05B 33/0818 315/250 |
| 2009/0179574 A1 | 7/2009 | Chang | |
| 2010/0053976 A1 | 3/2010 | Cornelissen et al. | |
| 2011/0122341 A1 | 5/2011 | Hayashi | |

FOREIGN PATENT DOCUMENTS

| | | |
|---|---|---|
| JP | 2009054913 A | 3/2009 |
| JP | 2010272410 A | 12/2010 |
| JP | 2011171739 A | 9/2011 |
| WO | 9812581 | 3/1998 |
| WO | 2007122566 A1 | 11/2007 |
| WO | 2008057491 A2 | 5/2008 |

* cited by examiner

TOPOLOGY OF DISTRIBUTING AND CONNECTING LEDS IN A LARGE AREA MATRIX

FIELD OF THE INVENTION

This invention relates to a low-cost and efficient topology for distributing and connecting LEDs in a large area matrix. By large area matrix is meant an array of LEDs spread over an area, for example an array of at least tens of LEDs, but more typically hundreds or even thousands.

BACKGROUND OF THE INVENTION

LED lighting applications can be made by combining a large number of low power, medium power, or even high power LEDs in a large-area matrix. This matrix will consist of a large number of LEDs in a parallel and series configuration.

It is known to form such a matrix of LEDs in which the LEDs are connected and powered by wires instead of an expensive PCB.

FIG. 1 shows a known arrangement in which an array of LEDs is connected by wires in a grid. A single high voltage rail 10 and a single low voltage rail 12 supply power to the LEDs 14. The LEDs are arranged in a regular matrix in rows and columns. The columns of LEDs have their anodes connected together and their cathodes connected together, with column lines. Thus, each column comprises a set of LEDs in parallel. There is a chain of these columns in series between the voltage rails.

An equivalent circuit diagram is shown in FIG. 2. The LEDs 14 are arranged as a series connection of columns 20. Each column 20 comprises a set of parallel LEDs 14. Note that each LED 14 can itself comprise a package containing several LEDs in series on in parallel.

If there are N columns 20, the voltage between the voltage rails 10, 12 needs to be N times the LED forward bias voltage drop (of for example 3V). The current to be delivered by the power supply is a function of the total number of LEDs.

The design is scalable, and can even be cut to size by shortening the column length. The mesh arrangement shown in FIG. 1 enables all the LEDs to be connected into the circuit with no overlapping wires and with only a single connection to each voltage rail.

The invention addresses the problem that a high voltage is needed if many LEDs are connected in series. For large values of N, the required voltage can become dangerous or can require expensive high-voltage insulation measures. The driving voltage may even exceed the mains voltage.

In order to scale the design, additional rows of LED can be added (so that each column 20 has a greater number of parallel diodes). For each additional row (of N diodes), a dedicated power supply has to be used, in order to deliver the required constant current. The required current depends on the number of LEDs in the mesh.

Thus, although the design in FIG. 1 is scalable, different scaling will require a different power source, which complicates the scaling of the design.

SUMMARY OF THE INVENTION

According to the invention, there is provided a circuit and method as defined in the independent claims.

According to one aspect of the invention, there is provided an LED circuit, comprising:

an array of LEDs or LED packages arranged in a matrix, with each LED or LED package connected within the matrix by connecting wires, and the matrix connected to voltage rails, wherein the voltage rails connect to at least three power rail lines distributed across the area of the matrix, wherein the LEDs or LED packages are formed as:

a first LED arrangement between a first power rail line and a second, adjacent, power rail line;

a second LED arrangement between the second power rail line and a third power rail line of the same voltage as the first power rail line, the third power rail line adjacent the second power rail line and on the opposite side of the second power rail line compared to the first power rail line.

In this design, the LEDs are arranged in sections between successive pairs of power rail lines—rather than all between a single pair of voltage rails. In this way, the driving voltage can be kept low and tuned to an optimum value (optimum from the point of view of energy consumption, cost, and safety for example). The LED arrangements have their anodes connected to a higher voltage power rail line and their cathodes connected to a lower voltage power rail line, so that the different sections are arranged with opposite polarity. By placing the LEDs in sections with different polarity direction, not only is it possible to drive the LEDs at a low (i.e. safe) voltage, but a modular approach for the power supply is also possible. The LED matrix can have arbitrary dimensions. It also allows the multiple LED arrangements of the matrix to be addressed individually if desired. The LED arrangements can be in the row or column direction, so that addressing row-by-row, or column-by-column, is made possible.

There can be a number N of power rail lines and a number N-1 of LED arrangements, each between an adjacent pair of the power rail lines, wherein the adjacent pair of power rail lines comprises one high power rail line and one low power rail line. In this way, the design is scalable in two dimensions. The power rail lines alternate in a first direction (for example a row direction), and the design can be scaled based on the number of power rail lines, and without changing the power rail line voltages.

The design can also be scaled in the perpendicular direction, by changing how many LEDs are in each arrangement.

For example, the first LED arrangement can comprise an LED bank between a first power rail line and a second power rail line, the first LED bank comprising one or more LEDs in parallel, and the second LED arrangement can comprise a second LED bank between the second power rail line and the third power rail line, the second LED bank comprising one or more LEDs in parallel.

The number of LEDs in parallel in each bank can be used to determine the scaling for a fixed number of power rail lines.

The first LED arrangement can comprise a first plurality of LED banks in series between the first power rail line and the second power rail line, each bank again comprising one or more LEDs in parallel, and the second LED arrangement can comprise a second plurality of LED banks in series between the second power rail line and the third power rail line, each bank comprising one or more LEDs in parallel.

The number of banks in series between the pair of power rail lines determines the required voltages. Thus a compromise can be found between the required voltage range and the number of power rail lines.

Each of the power rail lines can be connected to one of a high voltage rail and a low voltage rail. Furthermore, all high voltage power rail lines can be connected together and all low voltage power rail lines can be connected together. This means only one external high voltage line connection is needed and only one external low voltage line connection is needed.

A switching arrangement can be provided between each adjacent pair of power rail lines. This enables a shorting function to be implemented so that the LEDs coupled between a particular pair of power rail lines can be dimmed or turned off. This can be used to control the overall output brightness, or even the output colour, if different LEDs have different colour output. For example, the LEDs of the first LED arrangement can have a different output colour to the LEDs of the second LED arrangement.

The circuit can further comprise a power source with first and second voltage lines connected to the LED matrix, with one of the first and second voltage lines connected to each of the power rail lines. Thus, the power rail lines essentially distribute two voltage lines across the matrix, so that the matrix can be scaled without changing the voltage line voltages.

A separate power source can be connected to each of the higher voltage power rail lines, and/or a separate power source can be connected to each of the lower voltage power rail lines. When the matrix is scaled, power sources can be added/removed as required without redesigning the remaining power sources. Each of the separate power sources can have an individually controllable output current, and this can be used to implement local dimming of locally turning off LEDs.

In another aspect, the invention provides a method of driving an LED circuit, comprising:
  connecting an array of LEDs or LED packages in a matrix, with each LED connected within the matrix by connecting wires, and the matrix connected to voltage rails which are connected to at least three power rail lines distributed across the area of the matrix, wherein the method comprises:
  controlling the at least three power rail lines, thereby to drive a first LED arrangement between a first power rail line and a second, adjacent, power rail line and to drive a second LED arrangement between the second power rail line and a third power rail line of the same voltage as the first power rail line, the third power rail line adjacent the second power rail line and on the opposite side of the second power rail line compared to the first power rail line.

BRIEF DESCRIPTION OF THE DRAWINGS

Examples of the invention will be described in detail with reference to the accompanying drawings, in which.

DETAILED DESCRIPTION OF THE EMBODIMENTS

The invention provides an LED circuit in which an array of LEDs is arranged in a matrix. The matrix is connected to at least three power rail lines. The LEDs are formed as a first LED arrangement between a first power rail line and a second power rail line and a second LED arrangement between the second power rail line and a third power rail line of the same voltage as the first power rail line. This means there are alternating power rail lines interspersed with the matrix of LEDs. This enables the driving voltages to be kept low and it improves scalability of the design.

Figure 3:
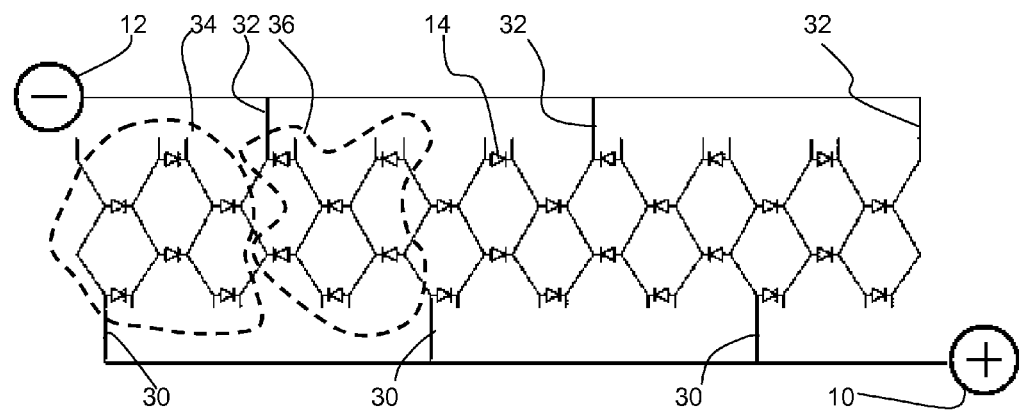
FIG. 3 shows a first example of an LED circuit of the invention.

A first embodiment according to the invention is shown in FIG. 3.

The LED circuit again comprises an array of LEDs 14 (or LED packages) arranged in a matrix, with each LED (or LED package) connected within the matrix by connecting wires, and the matrix connected to voltage rails 10,12.

The voltage rails connect to power rail lines for the LEDs 14 for supplying power. The term "power" rail line is simply used to distinguish over the (only) two "voltage" rails 10,12 to which all the power rail lines connect. A "power rail line" is simply a line to which a voltage is applied and which is used to deliver power (i.e. current) to the connected LEDs.

These power rail lines are distributed across the matrix, so that there are at least three power rail lines, which connect to the two voltage rails 10,12. There are alternating power rail lines interspersed with the matrix of LEDs. In the example shown, there are three (higher voltage) power rail lines 30 connected to the high voltage rail 10 and three (lower voltage) power rail lines 32 connected to the low voltage rail 12. The LEDs are formed as separate LED arrangements between adjacent power rail lines, wherein the adjacent power rail lines are one higher voltage power rail line and one lower voltage power rail line.

At the lower limit, the invention can be implemented with three power rail lines, for example the first two high power rail lines 30 to the left in FIG. 3 and the first low power rail line 32. In this case, there is only a first LED arrangement 34 between a first power rail line 30 and a second power rail line 32 and a second LED arrangement 36 between the second power rail line 32 and a third power rail line 30 of the same voltage as the first power rail line.

Each LED arrangement can at the limit be a single LED. It can instead be an LED packages which may include multiple LEDs. It can also be a series line of LEDs or LED packages, a parallel bank of LEDs or LED packages, or a series lines of parallel banks (as in FIG. 3).

FIG. 3 shows an example where each LED arrangement has banks of 2 LEDs in parallel, and there are 3 such banks in series. Thus, the LEDs of each LED arrangement are placed in a 2*3 matrix: 2 in the parallel direction and 3 in the series direction.

Figure 1:
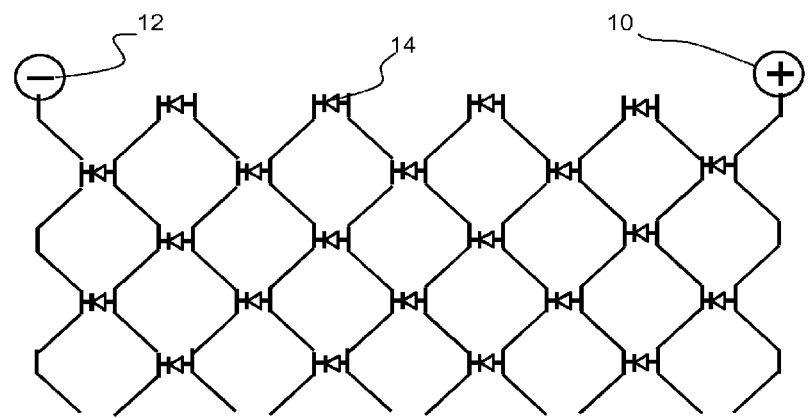
FIG. 1 shows a known LED matrix.
Figure 2:
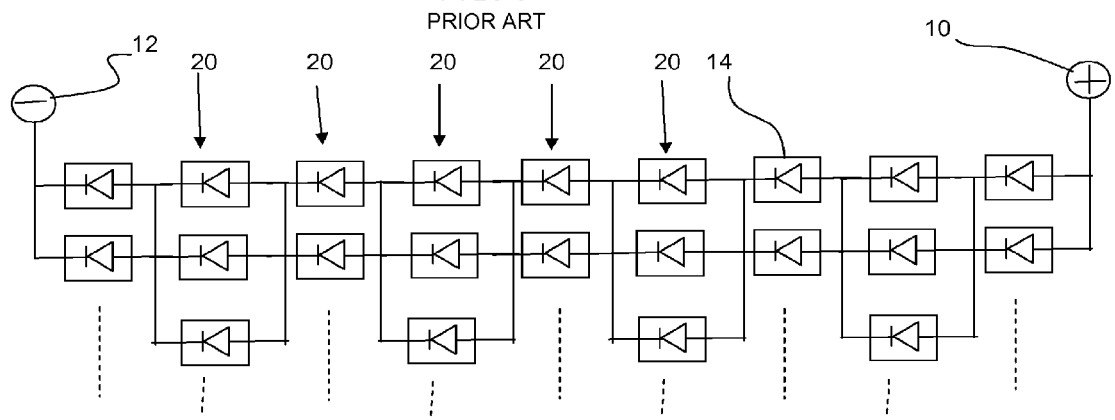
FIG. 2 shows an equivalent circuit of the LED matrix of FIG. 1.

For an LED voltage drop of 3V, by this approach the driving voltage is fixed to 3*3V=9V. For the normal configuration with the topology as shown in FIG. 1, this would be 15*3V=45V.

Figure 4:
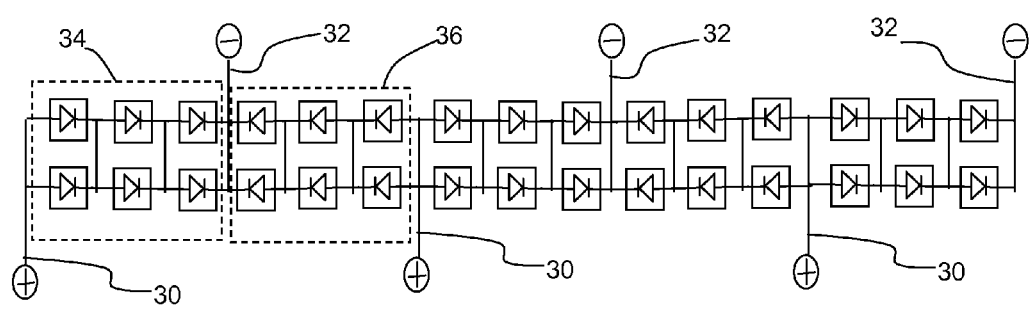
FIG. 4 shows an equivalent circuit of the LED matrix of FIG. 3.

The equivalent circuit is shown in FIG. 4.

This arrangement enables the matrix to be scaled in dimension in both orthogonal directions. In the example shown in FIG. 3, the power rail lines run in the column direction and they alternate in polarity in the row direction.

In this case, the matrix can be scaled in the row direction by increasing or decreasing the number of power rail lines. The matrix can be scaled in the column direction by increasing or decreasing the number of LEDs in parallel in each bank of the LED arrangements 34,36.

This scaling enables the matrix to be made as large as desired while still keeping the same driving voltage.

Of course, the larger the matrix, the larger the driving current. However, this can be achieved by simply starting from a driving supply with a fixed driving voltage range and fixed driving current range, and using as many of these supplies as needed to power the whole array. Thus, the number of a fixed design of driving supply can simply be correlated to the number of power rail lines 30,32.

This provides a modular approach which avoids the need to stitch separate matrices. This facilitates manufacturing of the array, for example allowing a continuous roll-to-roll manufacturing process instead of a more expensive batch process.

Figure 5:
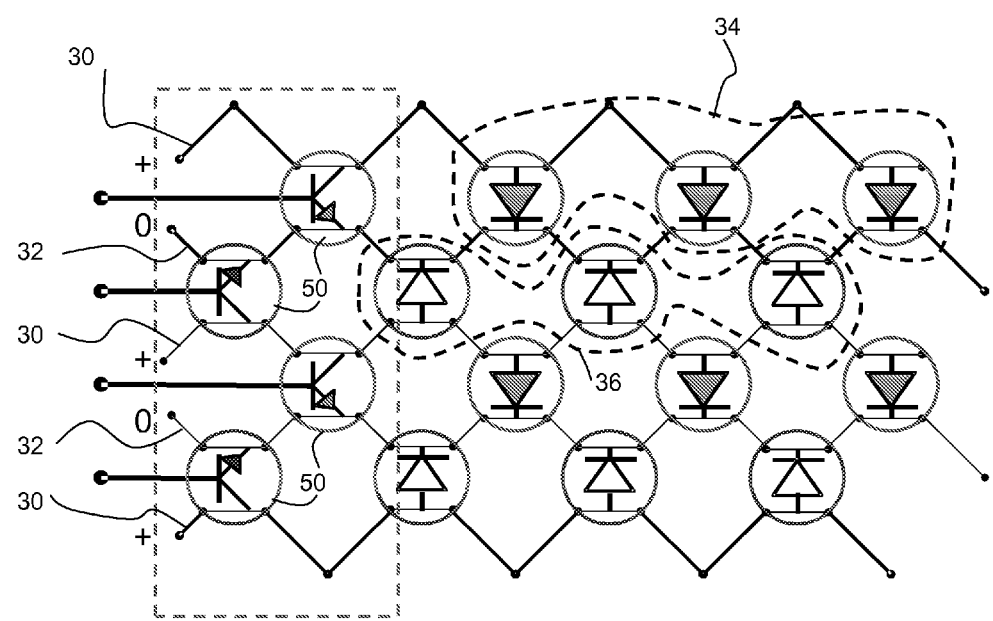
FIG. 5 shows a second example of an LED circuit of the invention.
Figure 6:
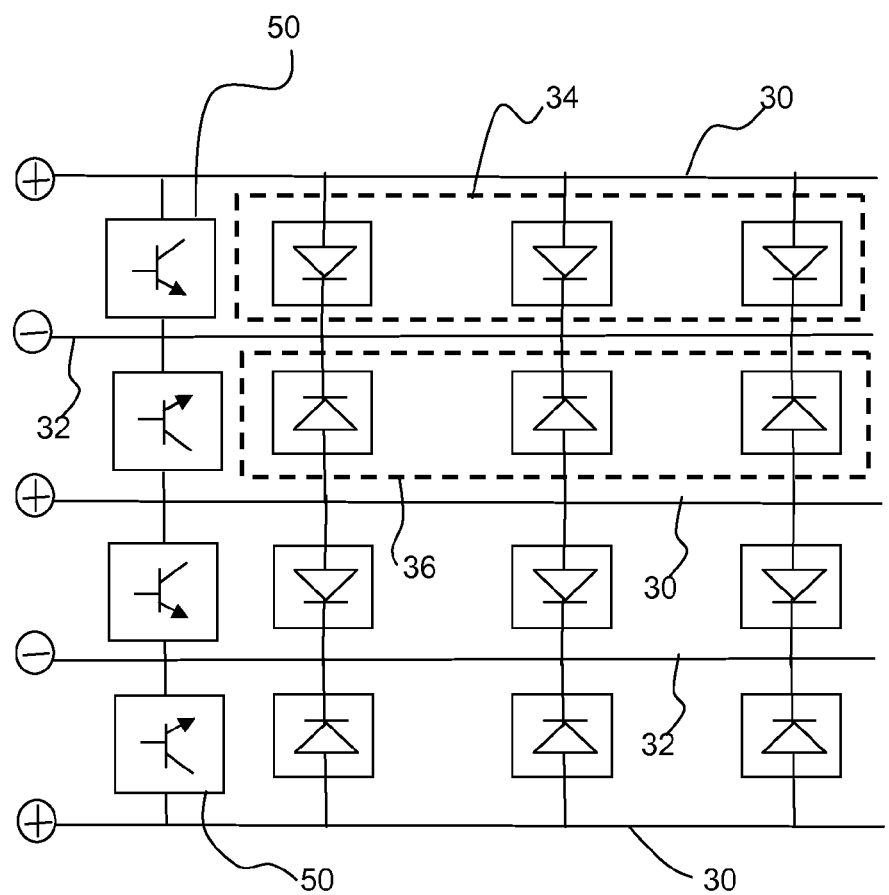
FIG. 6 shows an equivalent circuit of the LED matrix of FIG. 5.

A second embodiment according to the invention is shown in FIG. 5, with the equivalent circuit in FIG. 6.

The matrix layout is conceptually the same. However, the power rail lines 30,32 run in the row direction, and each LED arrangement 34,36 comprises a bank of three parallel LEDs.

The matrix is again scalable in two directions. The row direction scaling involves changing the number of LEDs in each parallel bank, whereas the column direction scaling involves changing the number of power rail lines.

FIGS. 5 and 6 are used to show that by running the power rail lines in the row direction, it is possible to allow for row-by-row switching or dimming of rows. Of course, with a 90 degree rotation, column-by-column control is possible.

In the layout shown in FIGS. 5 and 6, each row of LEDs can be addressed individually. This is enabled by using a switch 50 such as a transistor between each adjacent pair of power rail lines. This can be used to fully or partially short-circuit the power supply responsible for a particular row. A constant-current supply will then drive current through the shorting transistor. Alternatively, a switch can be placed in series with each power supply. For this option, referring to FIG. 5, there are several sub-options:

(i) Each power rail line 30 for the high power rail (labeled with +) can be switched between a 0 and + state (and states in between for dimming). This means that two rows can be switched at a time to a dimmed of off state.

(ii) All power rail lines 30 and 32 can be switched between a 0 and + state (and states in between for dimming). This means that an individual rows can be switched on or dimmed, in addition to the two-row control of (i) above.

It is also possible to make each row (or group of rows) emit light with a different colour.

FIG. 5 shows the odd rows of LEDs of one colour (shown grey in the figure.) and the even rows of another colour (shown white in the figure).

For example, the even rows can emit warm white and the odd rows emit cool-white. Using row-by-row addressing, the whole matrix can be controlled to emit on average light having any colour between that of warm white and cool-white. Dynamic patterns can also be created along the row or column direction (depending on the configuration of the power rail lines).

The invention can be applied in large area LED arrays for numerous applications such as for example office lighting.

The LEDs can be of known design, and for this reason they have not been described in detail. They comprise discrete packaged components to which the wire connections can be made. The matrix of wires and LEDs can be encapsulated in a transparent membrane.

The matrix of wires and LEDs can also be laminated to a flexible substrate such as a canvas or carpet. The wires can be conducting wires that are weaved into a textile.

In the examples shown, the two voltage rails are shown as "+" and "−" or "+" and "0". All that is needed is a voltage difference in order to suitably bias the LEDs. Thus, the actual voltages are not relevant—they may both be positive or both be negative.

As mentioned above, the power rail lines are distributed across the area of the matrix.

In the example of FIG. 3, the power rail lines alternate between the two voltages in the row direction, and the power rail lines run essentially in the column direction. Thus, from left to right (i.e. in the row direction) there are evenly spaced power rail lines alternating in polarity. To avoid crossovers, the power rail lines of one polarity extend up to connect to one of the voltage rail lines, and the power rail lines of the other polarity extend down to connect to the other of the voltage rail lines.

In the example of FIG. 5, the power rail lines alternate between the two voltages in the column direction, and the power rail lines run essentially in the row direction. Thus, from top to bottom (i.e. in the column direction) there are evenly spaced power rail lines alternating in polarity.

In general, the power rail lines are distributed substantially uniformly across the matrix area. By "substantially uniformly" is meant "uniformly if edge influences are ignored". This means that the matrix can be cut to size. The designs of FIG. 3 and FIG. 5 can each be cut to size in the row and column directions.

Each LED 14 shown in the Figs. can be an LED package of one or more LEDs.

As explained above, the invention at the limit can use only three power rail lines. However, there are preferably at least 4 power rail lines, and more preferably 10 or more, for example more than 20. The more power rail lines, the more ability to tailor the size of the matrix.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An LED circuit, comprising:
an array of LEDs arranged in a first matrix, each LED connected within the first matrix by connecting wires;
the first matrix interposed between a pair of voltage rails;
the pair of voltage rails are connected to at least three power rail lines distributed across the area of the first matrix;
wherein the LEDs connected within the first matrix include
a first LED arrangement between a first power rail line and a second, adjacent power rail line;
a second LED arrangement between the second power rail line and a third power rail line configured be of the same electrical potential as the power rail line;
the third power rail line adjacent the second power rail line and on the opposite side of the second power rail line compared to the first power rail line;
the first and second LED arrangements comprising a plurality of parallel pairs of LEDs in series alignment, each of said plurality of parallel pairs of LEDs being at least two LEDs in parallel and including a bridge interposed between each of said plurality of parallel pairs of LEDs, wherein the first and second arrangements are aligned cathode-to-cathode;

an array of LEDs arranged in a second matrix;

the second matrix interposed between the pair of voltage rails, wherein the second matrix is connected in parallel alignment with the first matrix and includes a third LED arrangement connected to the third power rail line; and the third LED arrangement comprising a plurality of parallel pairs of LEDs in series alignment, each of said plurality of parallel pairs of LEDs being at least two LEDs in parallel and including a bridge interposed between each of said plurality of parallel pairs of LEDs, wherein the second LED arrangement of the first matrix and the third LED arrangement of the second matrix are aligned anode-to-anode.

\* \* \* \* \*